United States Patent [19]

Mann

[11] Patent Number: 6,104,257
[45] Date of Patent: Aug. 15, 2000

[54] CRYSTAL OSCILLATOR WITH EPROM-CONTROLLED FREQUENCY TRIM

[75] Inventor: Eric N. Mann, Issaquah, Wash.

[73] Assignee: Cypress Semiconductor Corp., San Jose, Calif.

[21] Appl. No.: 08/995,485

[22] Filed: Dec. 22, 1997

[51] Int. Cl.[7] ............................. H03B 1/00; H03B 5/30; H03B 5/36

[52] U.S. Cl. ................................... 331/158; 331/116 FE; 331/179

[58] Field of Search ........................ 331/116 R, 116 FE, 331/158, 179

[56] References Cited

U.S. PATENT DOCUMENTS

| 5,036,294 | 7/1991 | McCaslin | 331/1 A |
| 5,084,685 | 1/1992 | Moller et al. | 331/179 X |
| 5,117,206 | 5/1992 | Imamura | 331/158 |
| 5,182,528 | 1/1993 | Zuta | 331/1 A |

*Primary Examiner*—David Mis
*Attorney, Agent, or Firm*—Christopher P. Maiorana, P.C.

[57] ABSTRACT

An apparatus comprising a storage circuit, a load circuit and an oscillator circuit. The storage circuit may be configured to store a number of configuration bits configured to provide one or more control signals. The load circuit may be configured to provide a variable magnitude load in response to the one or more control signals. The oscillator circuit may be configured to provide an output signal, where the output signal has (i) a frequency determined in response to the magnitude of the load circuit and (ii) a magnitude generated in response to a current generated in response to an output of a clamp circuit.

13 Claims, 5 Drawing Sheets

CRYSTAL OSCILLATOR WITH EPROM-CONTROLLED FREQUENCY TRIM

FIELD OF INVENTION

The present invention relates to frequency generators generally and, more particularly, to a timing crystal oscillator that may be tuned after production.

BACKGROUND OF THE INVENTION

Conventional approaches to implementing crystal or other resonant oscillators generally involve manufacturing a fixed capacitive load that is attached to the resonator. The fixed load is generally fabricated during the manufacturing process. As a result, the accuracy of the manufacturing process in a conventional oscillator plays an important role in determining the accuracy of the output clock, as does the manufacturing accuracy of the resonator.

Referring to FIG. 1, a circuit 10 illustrates one such conventional approach. The circuit 10 generally comprises a resistor 12, an inverter 14, a resistor 16, an inverter 18, a capacitor C1, a capacitor C2 and a crystal 20. One side of the crystal 20 is coupled between the capacitor C1 and the input of the inverter 14. A second side of the oscillator 20 is coupled to the capacitor C2 and the resistor 16. The resistor 16 is also coupled between the output of the inverter 14 and the input of the inverter 18. The output of the inverter 18 presents a signal FOUT. The signal FOUT oscillates at a particular frequency that is generally a function of the size of the capacitors C1 and C2. As a result, to change the frequency of oscillation of the signal FOUT, the size of the capacitors C1 and C2 must be adjusted during fabrication of the circuit 10.

Manufacturing processes generally have a certain amount of inherent inaccuracy. Since the circuit 10 relies on the accuracy of the manufacturing process to produce the signal FOUT, the overall accuracy of the circuit 10 may not be acceptable in certain design applications having specifications that demand extremely accurate tolerances for the frequency of oscillation of the signal FOUT. A computer motherboard is one example of such an application.

Oscillators used in watches may have configuration bits configured to trim the accuracy of the oscillator after production. The oscillator may typically be tuned to the range of parts per million. However, the oscillators used in watches are typically low speed oscillators and are generally not appropriate for high speed computer applications. Furthermore, the tuning is generally achieved with a mechanical trimming capacitor which is less desirable than electronic trimming.

SUMMARY OF THE INVENTION

The present invention concerns a timing crystal oscillator circuit that may be tuned after production. The circuit generally comprises a microprocessor configured to present one or more control signals, one or more load devices that may be activated in response to the control signals and a crystal oscillator for presenting an output signal having a frequency which is generally dependent on the number of load devices activated.

The objects, features and advantages of the present invention include providing a timing crystal oscillator that presents an output signal having a frequency that may be tuned after production.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
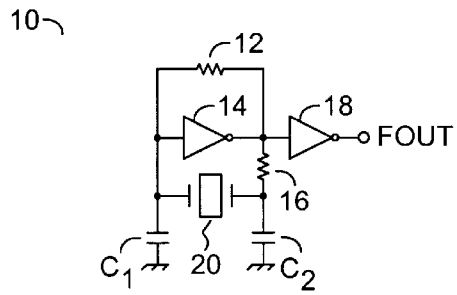
FIG. 1 is a circuit diagram of a conventional crystal oscillator.
Figure 2:
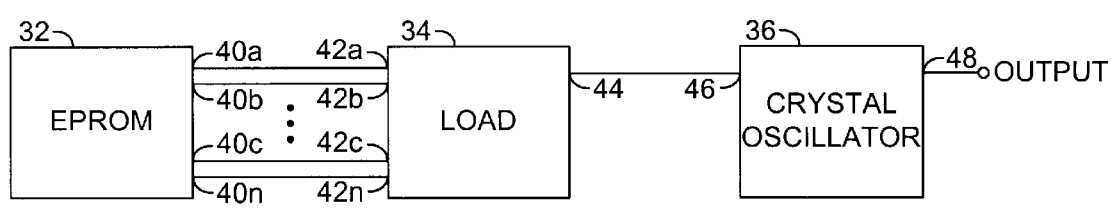
FIG. 2 is a block diagram of a preferred embodiment of the present invention.

Referring to FIG. 2, a block diagram of a circuit 30 is shown in accordance with a preferred embodiment of the present invention. The circuit 30 generally comprises an EPROM block (or circuit) 32, a load block (or circuit) 34 and a crystal oscillator block (or circuit) 36. The EPROM block 32 generally has a number of outputs 40a–40n. The load block 34 generally has a number of inputs 42a–42n. The EPROM block 32 presents a number of control signals to the outputs 40a–40n that may be received at the inputs 42a–42n of the load block 34. The control signals generally configure the amount of load capacitance produced by the load block 34 by enabling or disabling a number of loads internal to the load block 34. The control signals may be generated in response to a number of configuration bits internal to the EPROM block 32. The EPROM may be implemented as another type of non-volatile memory such as a flash memory, an EEPROM, etc.

An output 44 of the load block 34 is generally coupled to an input 46 of the crystal oscillator 36. The frequency of the oscillator 36 is generally controlled by a crystal oscillator but can be controlled by other types of resonators such as ceramic resonators. The impedance (or capacitance) generated by the load block 34 is generally presented to the input 46 of the crystal oscillator 36. The crystal oscillator 36 also has an output 48 that may present a signal (e.g., OUTPUT). The signal OUTPUT may be a periodic signal that oscillates a particular frequency. The particular frequency at which the signal OUTPUT oscillates may be determined by the amount of impedance (or capacitance) presented to the input 46. As a result, the EPROM block 32, in combination with the load block 34, may control the frequency of oscillation of the signal OUTPUT. Since the frequency of oscillation of the signal OUTPUT may be varied after production, the circuit 30 may be used in a variety of design applications including a computer motherboard. Additionally, a component manufacturer may produce a number of circuits 30 to fill a wide range of orders that previously may have been independently manufactured parts. Another important advantage is that resonators may be manufactured to relaxed tolerance standards and tuning may be used to adjust the oscillator to tighter standards.

Figure 3:
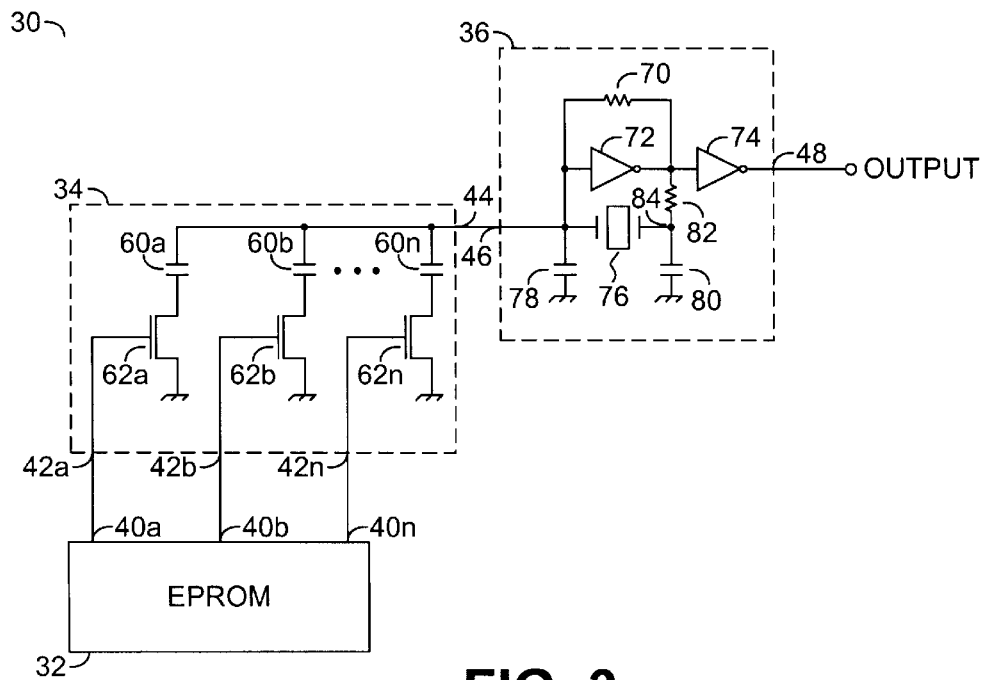
FIG. 3 is a circuit diagram of a preferred embodiment of the present invention.

Referring to FIG. 3, a circuit diagram of the circuit 30 is shown. The load section 34 is shown generally comprising a number of capacitors 60a, 60b and 60n and a number of switches 62a, 62b and 62n. The switch 62a is generally coupled between the capacitor 60a and the input 42a. The switch 62b is generally coupled between the capacitor 60b and the input 42b. Similarly, the switch 62n is generally coupled between the capacitor 60n and the input 42n. The EPROM 32 generally presents a number of control signals to the inputs 42a–42n that may turn the switches 62a–62n "ON" or "OFF" accordingly to provide the particular capacitance desired at the output 44. The switches 62a–62n may be implemented as transistors or other devices that may turn "ON" or "OFF" in response to a control signal. For example, if the switches 62a–62n are implemented as CMOS transistors, the switches may turn "ON" if a particular control signal is received at a gate. Conversely, if the control signal is not received at the gate, the transistor making up one of the switches 62a–62n may be turned "OFF". Generally, when the transistor is "ON", a particular number of the capacitors 60a–60n are connected between the output 44 and ground, which generally increases the capacitance at the output 44.

The number of capacitors 60a–60n and the number of switches 62a–62n may be adjusted in order to meet the design criteria of a particular application. For a relatively simple load block 34, a smaller number of capacitors 60a–60n and switches 62a–62n may be implemented. However, if greater control of the capacitance presented at the output 44 is desired, a larger number of capacitors 60a–60n and switches 62a–62n may be implemented.

In one example, the capacitors 60a–60n may be implemented in a one-to-one ratio with the switches 62a–62n. However, it may be desirable to provide other ratios between the capacitors 60a–62n and the switches 62a–62n. A particularly useful alternate is to use binary weighting for the capacitors 60a –60n. In this scheme a unit capacitor representing the resolution of an array (i.e., the capacitors 60a–60n) may be selected. The least significant control bit may switch one of the capacitors 60a–60n in and out. The next control bit selects one of the capacitors 60a–60n that may have twice the capacitance of the first capacitor. The next capacitors 60a–60n may have four times the capacitance of the first, with each subsequent control bit selecting one of the switches 62a–62n that may control a capacitance which is twice the value of the previous capacitance. This array implementation may facilitate direct control of a tuning array with a wide range and resolution while using a minimum number of capacitors 60a–60n.

The oscillator section 36 generally comprises a resistor 70, an inverter 72, an inverter 74, a resonator 76 (which is generally implemented as a crystal or ceramic resonator), a capacitor 78 and a capacitor 80. The capacitors 78 and 80 may be fixed capacitors tuned to produce the lowest frequency desirable at the output 48. With such a configuration, the capacitors 78 and 80 may be combined with the capacitance received at the input 46 to determine the overall frequency of oscillation of the signal OUTPUT. The capacitance received may be coupled to the output side of the oscillator inverter (node 84) instead of to the input if such a configuration is desired to meet the needs of a particular application. If none of the capacitors 60a–60n are activated by the switches 62a–62n, the oscillator section 36 will generally still function properly because capacitors 78 generally sets the minimum load capacitance. The particular configuration of the components of the oscillator block 36 illustrate one example of an oscillator. Other oscillators may be substituted in order to meet the design criteria of a particular application. Whatever the specific implementation of the oscillator block 36, the load block 34 may continue to provide the appropriate adjustment of the frequency of oscillation 48 after fabrication of the circuit 30.

Figure 4:
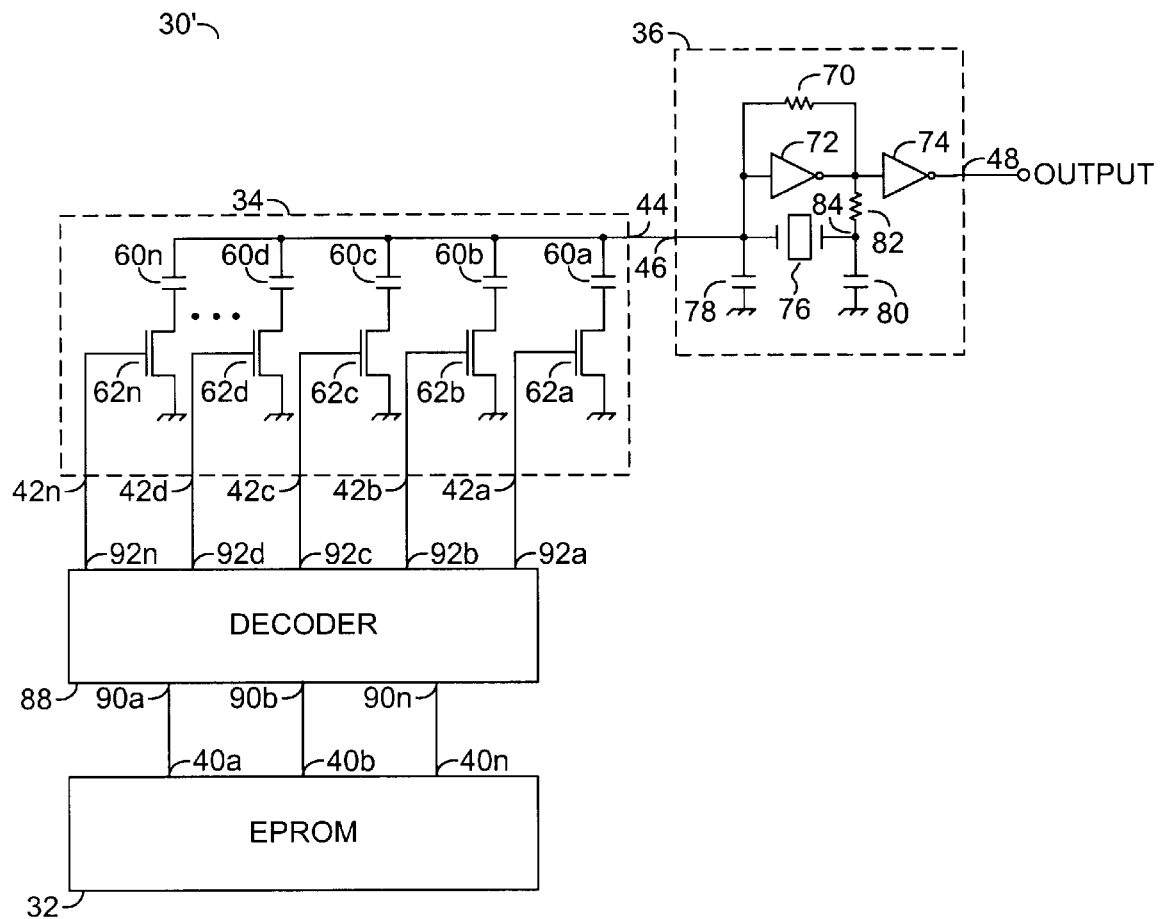
FIG. 4 is a circuit diagram of an alternate embodiment of the present invention.

Referring to FIG. 4, an alternate embodiment of a circuit 30' is shown. The circuit 30' further comprises a decoder block 88 coupled between the EPROM 32 and the load block 34. The decoder block 88 generally receives the signals from the outputs 40a–40n at a number of inputs 90a–90n and presents a greater number of control signals at a number of outputs 92a, 92b, 92c, 92d . . . 92n, that may be presented to inputs 42a–42n. The circuit 30' generally increases the number of combinations of capacitance that may be presented at the output 44 while using the same number of outputs 40a–40n from the EPROM block 32. Specifically, if three outputs 40a–40n are implemented, $2^n$ (or 8) combinations may result. The implementation of the decoder 88 may be useful if the outputs 40a–40n of the EPROM 32 are limited due to other design considerations.

Figure 5:
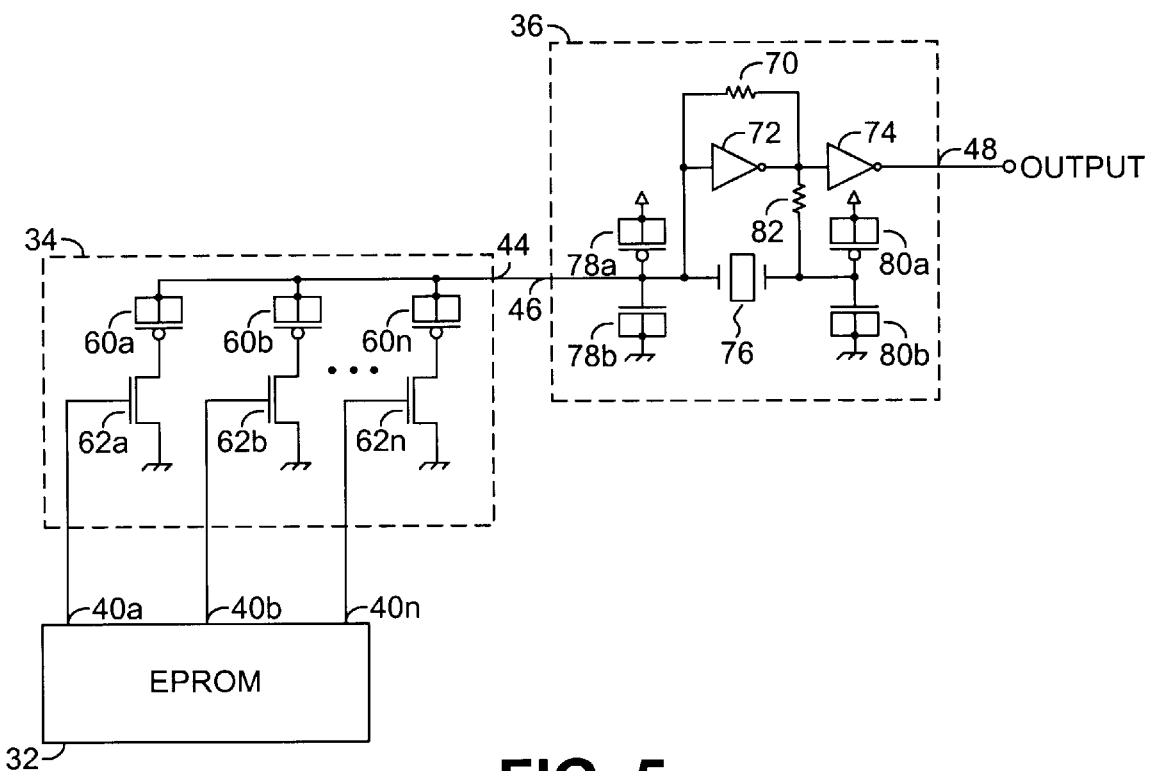
FIG. 5 is a more detailed circuit diagram of a preferred embodiment of the present invention.
Figure 6:
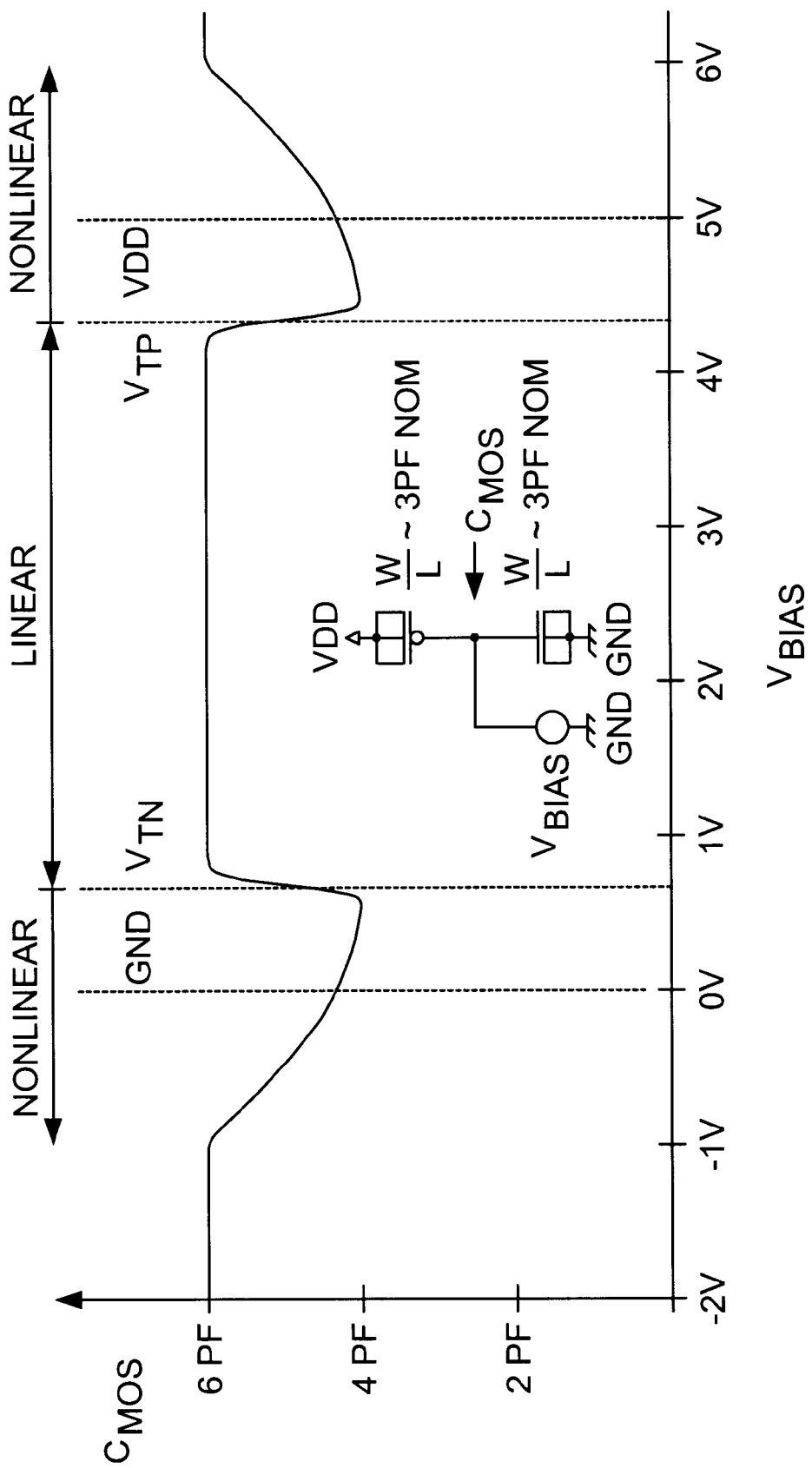
FIG. 6 is a chart of capacitance versus voltage for a capacitor implemented with MOS transistors.

For low cost implementations, the oscillator load capacitors 78, 80 and 60a–60n shown in FIG. 3 may be implemented as MOS capacitors as shown in FIG. 5. MOS capacitors may be implemented with standard MOS transistors having a gate acting as one capacitor plate and the source/drain/body as the other plate. Unless special processing steps (which usually add extra manufacturing cost) such as buried implants are added to conventional MOS and CMOS processes, circuit techniques are generally required to accommodate the non-linear capacitance versus voltage characteristics of MOS capacitors as shown in FIG. 6. Since the linear region shrinks as operating voltage Vdd is reduced, the nonlinear characteristics of the capacitor may become more significant as operating voltage requirements are reduced from 5V to, for example, 3.3V, 2.5V or lower.

Figure 7:
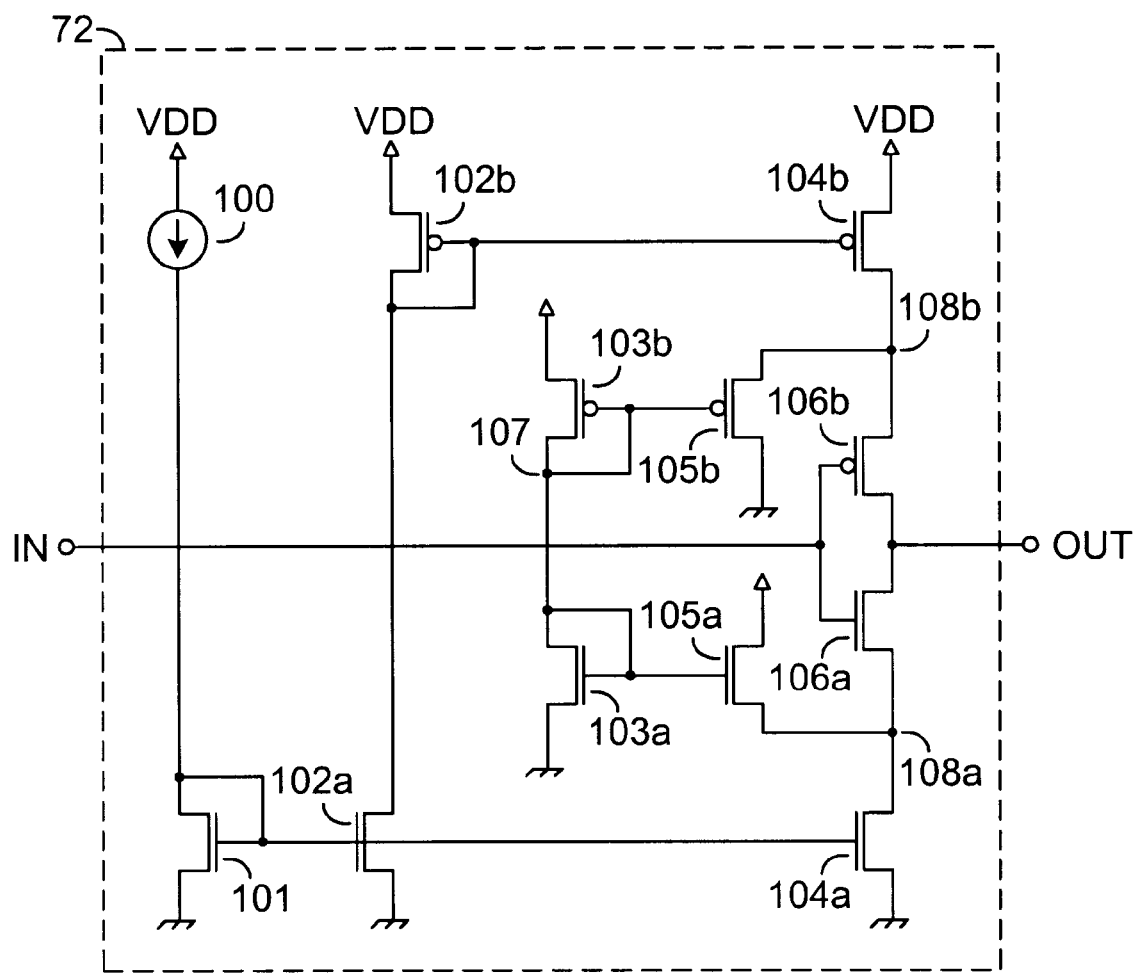
FIG. 7 is a circuit diagram for an inverter with a limited output voltage swing.

One circuit technique which may be employed to compensate for the non-linear MOS capacitor is to reduce the voltage swing of the oscillator so operation may be maintained in the linear portion of the MOS capacitor characteristic of FIG. 6. FIG. 7 illustrates one implementation of a circuit which limits the voltage swing of an inverter and replaces the inverter 72 in FIG. 3.

FIG. 7 illustrates a current source 100 which establishes a reference current through a transistor 101 which may be mirrored by a transistor 102a and a transistor 104a. A transistor 102b may be connected to transistor 102a to mirror the reference current in a transistor 104b. The transistors 104a and 104b generally establish the current available for the conventional inverter formed by a transistor 106a and a transistor 106b. A transistor 103a and a transistor 103b may be connected to form a voltage divider between Vdd and Gnd, which may generate a reference voltage which may normally be set to Vdd/2. A transistor 105a may form a clamp which shunts current from the current source transistor 104a when the potential at a node 108a is less than a voltage divider bias 107 minus the threshold of voltage (Vt) of the transistor 105a. A transistor 105b may form a clamp which shunts current from the current source transistor 104b when the potential at a node 108b is more than the voltage divider bias 107 plus the threshold of voltage (Vt) of the transistor 105b. The effect of the shunt transistors 105a and 105b is to limit the voltage to the threshold voltage Vt of the transistor 105a plus the threshold voltage Vt of transistor 105b, or approximately 2* Vt. The swing may be centered around the divider bias voltage 107. The circuit in FIG. 7 may provide an output voltage swing centered in the linear portion of FIG. 6, which may facilitate the use of low cost MOS capacitors for the oscillator.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a storage circuit configured to store a number of configuration bits configured to provide one or more control signals;
   a load circuit configured to provide a variable magnitude load in response to said one or more control signals; and
   an oscillator circuit configured to provide an output signal, wherein said output signal has (i) a frequency determined in response to the magnitude of said load circuit and (ii) a magnitude generated in response to a current generated in response to an output of a clamp circuit.

2. The circuit according to claim 1 wherein said configuration bits are adjusted after fabrication of the circuit.

3. The circuit according to claim 1 wherein said storage circuit comprises an erasable programmable read only memory (EPROM).

4. The circuit according to claim 1 wherein said load circuit comprises one or more load devices that may be activated in response to said control signals.

5. The circuit according to claim 1 wherein said oscillator circuit comprises a crystal oscillator.

6. The circuit according to claim 4 wherein each of said load devices is activated in response to one of said control signals.

7. The circuit according to claim 4 wherein two or more said load devices are activated in response to one of said control signals.

8. A crystal oscillator for use in a computer motherboard comprising the circuit of claim 1.

9. The circuit according to claim 1, wherein said oscillator comprises one or more devices and said clamp circuit is configured to control an output voltage swing centered in a linear region of said devices.

10. The circuit according to claim 9, wherein said voltage swing is two times the threshold voltage of said clamp circuit.

11. A method for generating a variable frequency clock signal, comprising the steps of:
    storing a number of configuration bits;
    generating a variable magnitude load in response to said configuration bits;
    generating a current in response to a clamp; and
    generating said variable frequency clock signal having (i) a frequency which is dependent on the magnitude of the variable magnitude load and (ii) a magnitude generated in response to said current.

12. The method according to claim 11 wherein said configuration bits are stored on an erasable programmable read only memory (EPROM).

13. A circuit comprising:
    means for storing a number of configuration bits for generating one or more control signals;
    means for providing a variable magnitude load in response to said one or more control signals; and
    means for providing an output signal, wherein said output signal has (i) a frequency determined in response to the magnitude of said variable magnitude load and (ii) a magnitude generated in response to a current generated in response to a clamp.

* * * * *